United States Patent [19]

Ochi

[11] Patent Number: 5,066,903
[45] Date of Patent: Nov. 19, 1991

[54] OPTICAL CURRENT TRANSFORMER

[75] Inventor: Naoki Ochi, Amagasaki, Japan

[73] Assignee: Mitsubishi Denki Kabushiki Kaisha, Tokyo, Japan

[21] Appl. No.: 608,813

[22] Filed: Nov. 5, 1990

[30] Foreign Application Priority Data

Dec. 14, 1989 [JP] Japan .................................. 1-326289

[51] Int. Cl.⁵ ...................... G01R 33/032; G01R 1/20
[52] U.S. Cl. ...................................... 324/96; 324/107; 324/127
[58] Field of Search ...................... 324/96, 127, 117 R, 324/117 H, 107

[56] References Cited

U.S. PATENT DOCUMENTS

| 3,324,393 | 6/1967 | Casey et al. | 324/127 |
| 3,413,055 | 11/1968 | DeSorbo | 324/96 |
| 4,894,609 | 1/1990 | Fujiki et al. | 324/107 |

FOREIGN PATENT DOCUMENTS 59-198359 11/1984 Japan .

OTHER PUBLICATIONS

"Devel. of Fiber-Optic Voltage Sensors & Magnetic-Field Sensors", T. Mitsui et al., IEEE Trans. on Power Del., vol. PWRD-2, No. 1, pp. 87-93 (Jan. 1987).
"Recent Devel. of Unconventional Instrument Transformers," N. Ohashi et al., CIGRE SC 34, pp. 1-15 (Jun. 1987).

Primary Examiner—Ernest F. Karlsen
Attorney, Agent, or Firm—Burns, Doane, Swecker & Mathis

[57] ABSTRACT

An optical current transformer, which uses a Faraday cell for detecting the intensity of a magnetic flux induced in a circular iron core, has plural windings having the same number of turns provided on the core in a manner that overall width of the windings are evenly wound along the whole part of the circular iron core, and terminal of the windings having the same polarities are commonly connected by cables.

2 Claims, 4 Drawing Sheets

OPTICAL CURRENT TRANSFORMER

BACKGROUND OF THE INVENTION

1. FIELD OF THE INVENTION

The present invention relates to an optical current transformer using combination of a magnetic core and a magnetic detecting device such as optical cell.

2. DESCRIPTION OF THE PRIOR ART

A conventional optical current transformer, for example, shown in Published Unexamined Japanese Patent Application Sho 59-198359 is described referring to FIG. 5 and 6.

FIG. 5 is a sectional front view showing three-phase gas insulation bus bars using a conventional optical current transformer 5. In FIG. 5, three bus bars 2, 3 and 4 are positioned in a tube-shaped housing 1 which is made of metal. The conventional optical current transformers 5 are provided around the bus bars 2, 3 and 4.

Details of the conventional optical current transformer 5 is shown in FIG. 6. In FIG. 6, a C-letter-shaped iron core 6 with a gap part 7 which is filled by plastics or glass forms a ring-shaped magnetic path which interlinks the bus bar 2. A Faraday cell 8, which is one of magnetooptical cells, is provided in the gap part 7 of the core 6. Optical fibers 9a and 9b are connected to the Faraday cell 8. The optical fiber 9a is used for supplying a light beam to the Faraday cell 8 and the other optical fiber 9b is used for guiding the light from the Faraday cell 8 to a photoelectrical signal processing apparatus 15 transforming the light beam to an electric signal. A winding 10 is provided in the gap part 7 and in the vicinity of the gap part 7 of the core 6 for canceling external magnetic field. Another winding 11 is provided in a part of the core 6 symmetrically to the winding 10 against the bus bar for detecting the external magnetic field. Number of turns of the windings 10 and 11 are selected equal to each other. And the windings 10 and 11 are connected in a manner that voltages induced in the windings 10 and 11 by a main magnetic flux $\phi 1$ induced by the current in the bus bar 2 and circulating in the core 6 are canceled each other, since plural voltage sources of equal electromotive forces are connected commonly without any load to it.

Operation of the conventional optical current transformer 5 is described.

When a current which is to be detected flows in the bus bar 2, the main magnetic flux $\phi 1$ in proportion to the intensity of the current circulates in the core 6. The main magnetic flux $\phi 1$ also flows in the gap part 7. Hereupon, when a light beam is supplied to the Faraday cell 8 via the optical fiber 9a, the light beam is modulated in proportion to the intensity of a magnetic field due to the main magnetic flux $\phi 1$ in the Faraday cell 8. The modulated light beam is outputted from the Faraday cell 8 via the optical fiber 9b and is photoelectrically transformed by the signal processing apparatus 15. As a result, the intensity of the current flowing in the bus bar 2 is detected.

The windings 10 and 11 are used for restraining undersirable influences caused by external magnetic flux $\phi m$ (shown in FIG. 6) generated by currents flowing in the other bus bars 3 and 4 (shown in FIG. 5). As shown in FIG. 6, assuming the external magnetic flux $\phi m$ is applied to the windings 10 and 11 even, then, the voltages induced in the windings 10 and 11 by the external magnetic flux $\phi m$ are not canceled each other, and the winding 10 generates a magnetic flux which has opposite direction to that of the external magnetic flux $\phi m$. As a result, the part of the external magnetic flux $\phi m$ which is in the gap part 7 is canceled by the magnetic flux generated by the winding 10. That is, by the existences of the windings 10 and 11 on symmetrically opposite parts on the circular iron core 6, undersirable influencing to the main magnetic flux $\phi 1$ in the circular core 6 by the external magnetic flux $\phi m$ is reduced by the canceling. And thereby the inherent current detection of the conventional optical current transformer 5 is not injured.

However, in the above-mentioned conventional optical current transformer 5, the number of the windings 10 and 11 are only two, and the widths thereof are not large enough, thereby leaving considerable part of the circular core 6 un-wound. Hence, there is a problem that the influences caused by the external magnetic flux $\phi m$ are not sufficiently or ideally removed, because the windings 10 and 11 for removing the influence caused by the external magnetic flux $\phi m$ are only provided in the gap part 7 and in the vicinity of the gap part 7, as well as the parts symmetrically opposite thereto, respectively.

However, in the actual housing 1, the external magnetic flux $\phi m$ is not ideally uniform nor straight. And in such case, the protection function by the windings 10 and 11 is not perfect, and the influences in the parts of the core 6 which is other than the gap part 7 by the external magnetic flux $\phi m$ is induced. Therefore, magnetic permeabilities of various parts of the core 6 becomes uneven because of unevenness of the intensities and directions of the external magnetic flux $\phi m$, and hence, overall magnetic reluctance of the core 6 is varied from designed value, depending on the path and unevenness of the external magnetic flux $\phi m$. As a result, an error component of output current caused by the external magnetic flux $\phi m$ is reflected in the measured current, and the magnetic flux detected by the faraday cell 8 contains error.

SUMMARY OF THE INVENTION

Purpose of the present invention is to provide an improved optical current transformer wherein error component which is contained in a detected signal and caused by external magnetic flux is drastically reduced in comparison with the conventional case.

An optical current transformer in accordance with the present invention comprises:

a C-letter-shaped circular iron core which has a gap part and is provided to interlink around a bus bar in which a current to be detected flows;

a magnetooptical cell which is provided in the gap part of the core for detecting a magnetic flux induced in the core for outputting a physically changed signal responding to intensity of the magnetic flux;

means for measuring from the physically changed signal; and at least four windings which have the same number of turns, width of the windings being evenly provided along the whole part of the circular iron core, and terminals of respective of the windings having the same polarity being commonly connected.

Polarities and intensities of voltages induced in the respective windings by the main magnetic flux are equal. Therefore, no electric current is induced in the windings by the voltages. And hence, the windings do not influence the result of the current detection of the optical current transformer in accordance with the present invention.

On the contrary, in respect of external magnetic flux intruded from the exterior, numbers of interlinkage and directions of the external magnetic flux in the respective windings are generally different for respective windings. Therefore, differences occur in the polarities and the magnitude of the voltages induced in the respective windings by the external magnetic flux. As a result, electric current flows among the windings and the influence of the external magnetic flux is reduced in the whole parts of the core.

It will be recognized that some or all of the Figures are schematic representations for purposes of illustration and do not necessarily depict the actual relative sizes or locations of the elements shown.

DESCRIPTION OF THE PREFERRED EMBODIMENTS

Figure 1:
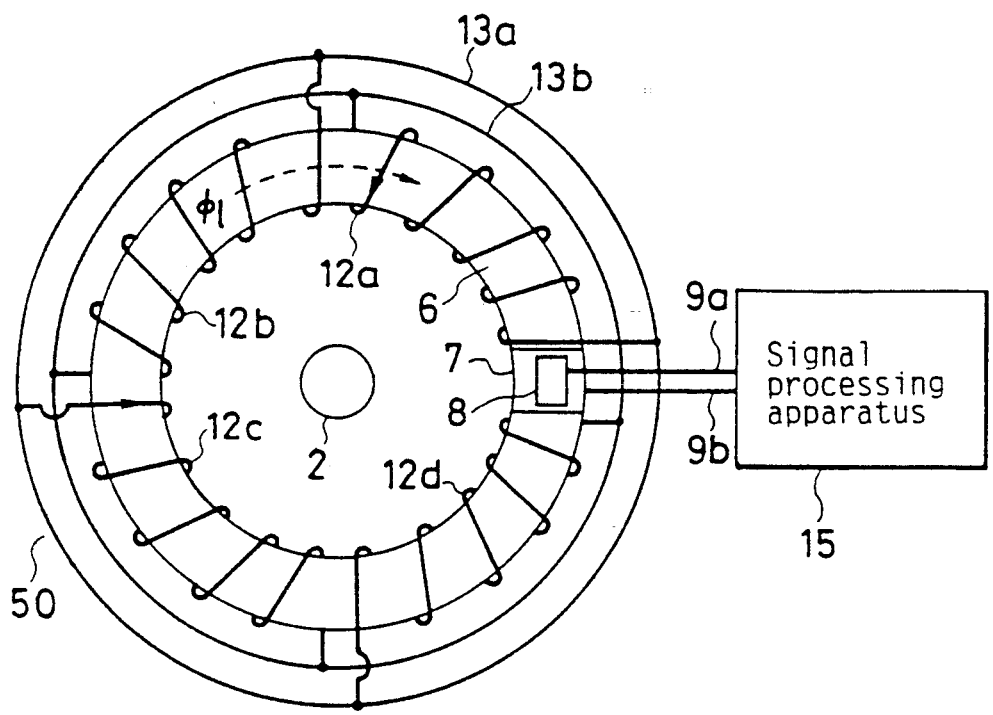
FIG. 1(A) is a block diagram showing a constitution of a preferred embodiment of an optical current transformer in accordance with the present invention.
FIG. 1(B) is a sectional front view showing a constitution of three-phase gas insulation bus bars using optical current transformers in accordance with the present invention.
Figure 2:
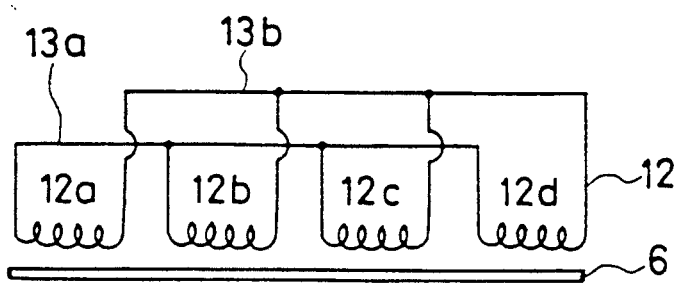
FIG. 2 is a connection diagram of windings 12a, 12b, 12c and 12d shown in FIG. 1(A).
Figure 1B:
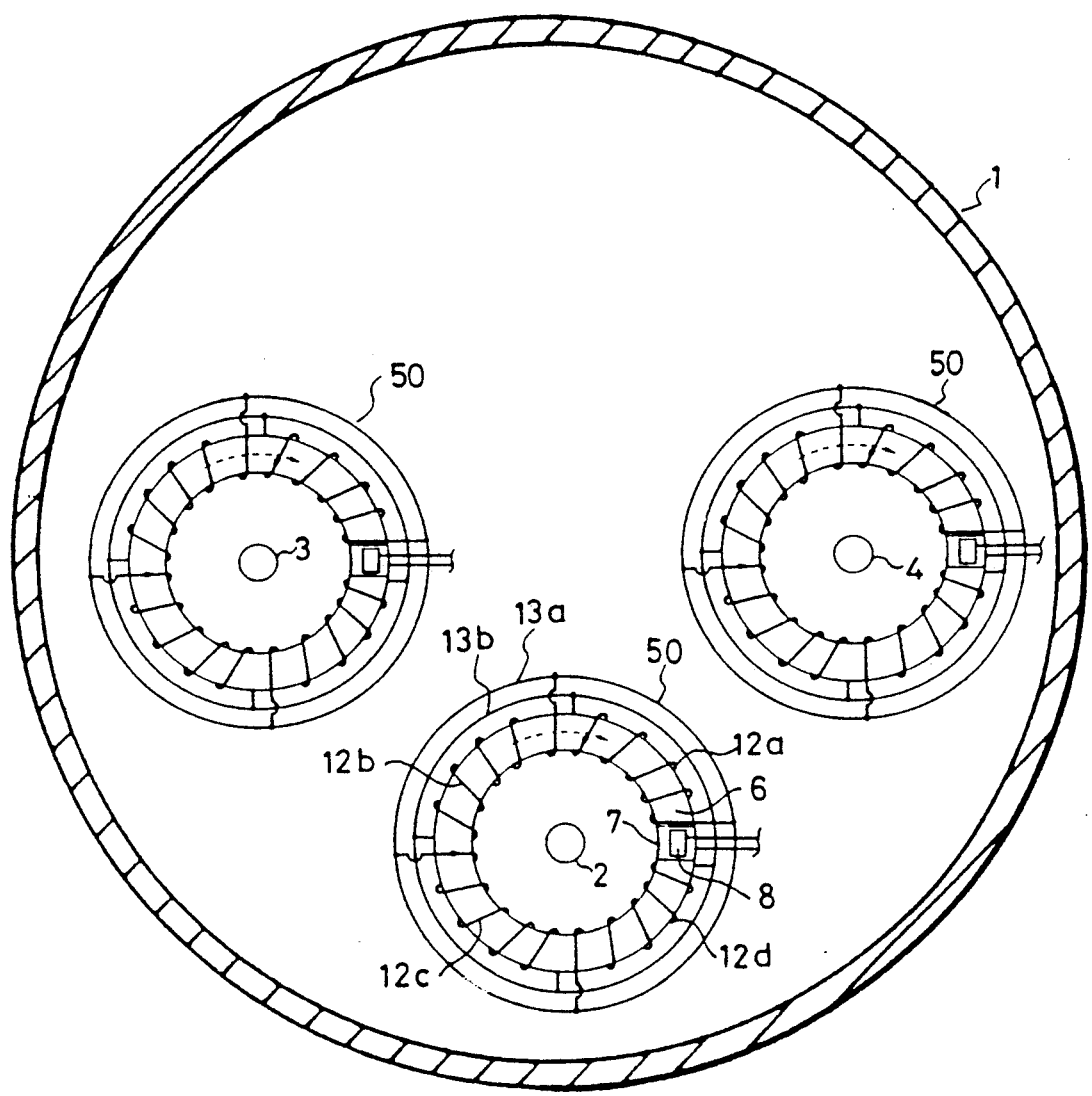
Figure 3:
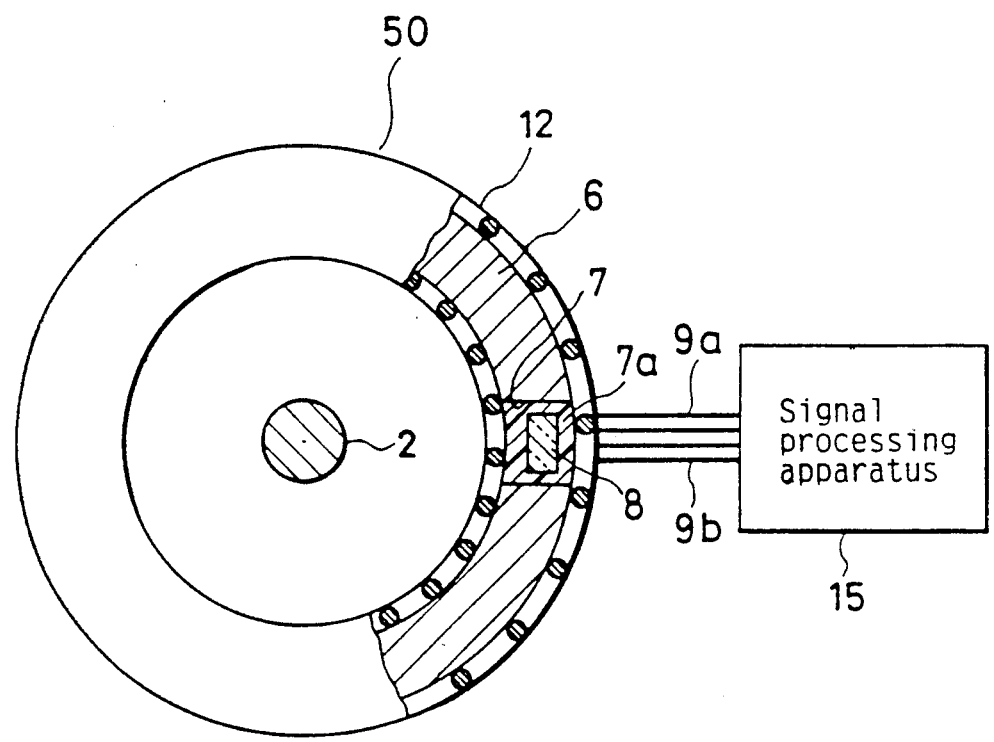
FIG. 3 is a partially sectional front view showing the optical current transformer in accordance with the present invention.

A preferred embodiment of an optical current transformer in accordance with the present invention is described referring to FIGS. 1(A), 1(B), 2 and 3. FIG. 1(A) is a block diagram of the optical current transformer 50 in accordance with the present invention. FIG. 1(B) is a sectional front view showing a constitution of three-phase gas insulation bus bars using optical current transformers shown in FIG. 1(A). FIG. 2 is a connection diagram of FIG. 1(A). FIG. 3 is a partially sectional front view of the optical current transformer 50 of FIG. 1(A).

In FIG. 1(B), three bus bars 2, 3 and 4 are located in a tube-shaped housing 1 which is made of metal. And the optical current transformers 5 in accordance with the present invention are provided around the bus bars 2, 3 and 4.

In FIG. 1(A), a C-letter-shaped iron core 6 with a gap part 7 forms a ring-shaped magnetic path which interlinks the bus bar 2. A spacer 7a is fit in the gap part 7 as shown in FIG. 3. A Faraday cell 8 as a magnetooptical cell is provided in the gap part 7. Optical fibers 9a and 9b are connected to the Faraday cell 8. The optical fiber 9a is used for supplying a light beam to the Faraday cell 8 and the other optical fiber 9b is used for guiding the light beam from the Faraday cell 8 to a signal processing apparatus 15. The signal processing apparatus 15 photoelectrically transforms the light beam to an electric signal.

Four windings 12a, 12b, 12c and 12d are wound uniformly around the core 6 in a manner to continuously cover the surface of the core 6. Numbers of turns of the respective windings 12a, 12b, 12c and 12d are selected equal and overall windings 12a, 12b, 12c and 12d are evenly wound around the whole length of the core 6. Terminals of the windings 12a, 12b, 12c and 12d, which have the same polarity, are connected by cables 13a and 13b in parallel.

Operation of the optical current transformer 50 in accordance with the present invention is described.

When a current which is to be detected flows in the bus bar 2, the main magnetic flux $\phi 1$ in proportion to the intensity of the current circulates in the core 6. The main magnetic flux $\phi 1$ also flows in the gap part 7. Hereupon, when a light beam is supplied to the Faraday cell 8 via the optical fiber 9a, the light is modulated responding to the intensity of a magnetic field due to the main magnetic flux $\phi 1$ in the Faraday cell 8. The modulated light beam is outputted from the Faraday cell 8 via the optical fiber 9b to the signal processing apparatus 15. And the light beam is photoelectrically transformed by the signal processing apparatus 15. As a result, the intensity of the current flowing in the bus bar 2 is detected.

At this time, voltages are induced in respective windings 12a, 12b, 12c and 12d by the main magnetic flux $\phi 1$ which is induced by the current in the bus bar 2 disposed in the center of the ring-shaped core 6. The polarities and the intensities of the respective voltages are equal, and furthermore, terminals of the same polarity of the windings 12a, 12b, 12c and 12d are commonly connected by the cables 13a and 13b. Therefore, the voltages are mutually canceled by each other, and hence, no current flows in any of the windings 12a, 12b, 12c and 12d, since plural voltage sources of equal electromotive forces are connected commonly without any load. Namely, the windings 12a, 12b, 12c and 12d do not any function by the main magnetic flux $\phi 1$, so that they do not influence the magnetic field in the gap part 7.

Figure 5:
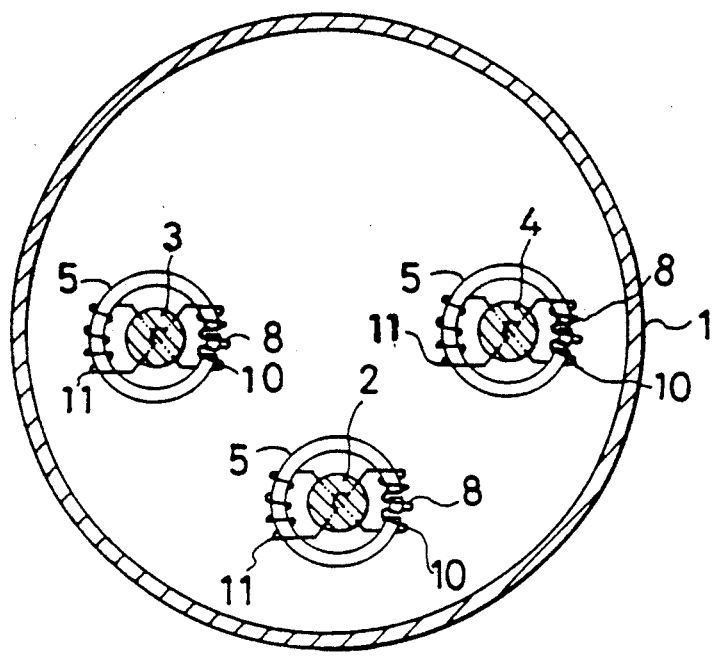
FIG. 5 is the sectional front view showing the constitution of the typical three-phase gas insulation bus bars using the conventional optical current transformers.
Figure 6:
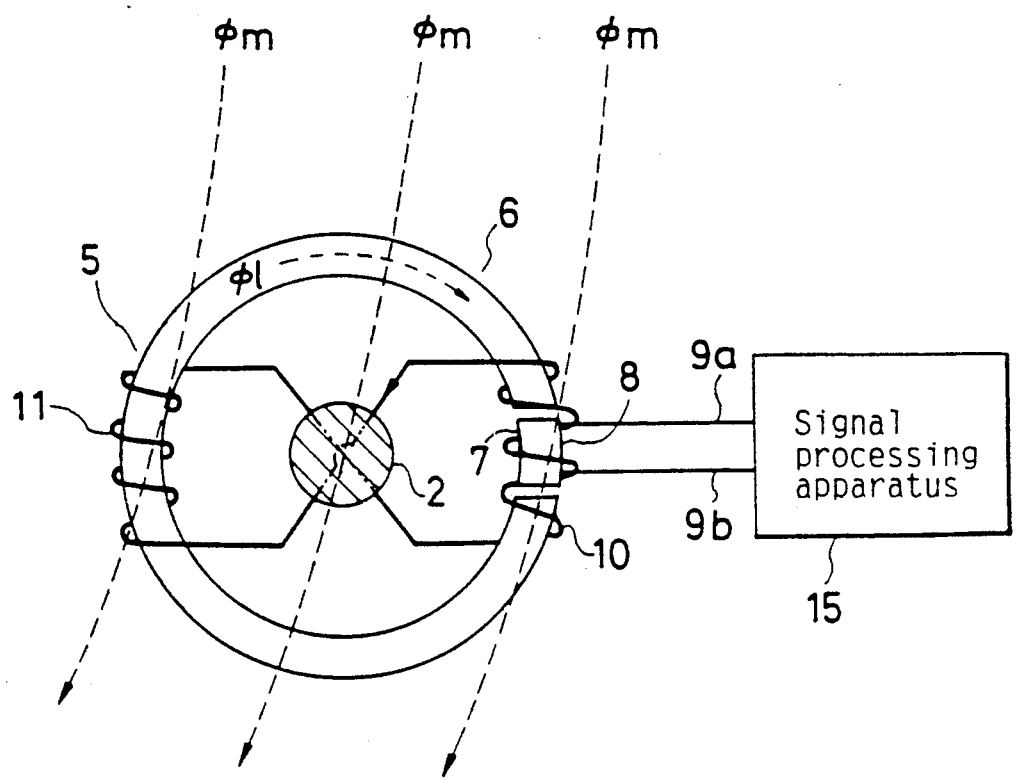
FIG. 6 is the block diagram of the conventional optical current transformer.

On the other hand, external magnetic flux $\phi m$ is generated by electric currents flowing in the other bus bars, for example, 3 and 4 shown in FIG. 5. The external magnetic flux $\phi m$ intrudes into the optical current transformer 50. Therefore, voltage are induced in the windings 12a, 12b 12c and 12d by the external magnetic flux $\phi m$. In this case, since the external magnetic flux $\phi m$ interlinks with the respective of the windings 12a, 12b, 12c and 12d in the directions, which are different from each other. The polarities and the intensities of the voltages induced in the windings 12a, 12b, 12c and 12d are different from each other. As a result, electric currents responding to the differences among the voltages flow in respective of the windings 12a, 12b, 12c and 12d via the cables 13a and 13b. Therefore, the currents of both directions and intensities for canceling the external magnetic flux $\phi m$ flow. Since the whole of the core 6 is uniformly covered by equally made windings 12a, 12b, 12c and 12d, the influence of the external magnetic flux $\phi m$ is removed from not only the gap part 7 but also the whole parts of the core 6. Accordingly, magnetic reluctance of the whole parts of the core 6 is protected from the influence by the external magnetic flux $\phi m$, and hence, error component caused by the change of the magnetic reluctance of the core 6, which may be contained in the detected signal is removed. And thereby the accuracy as the current transformer is improved.

Figure 4:
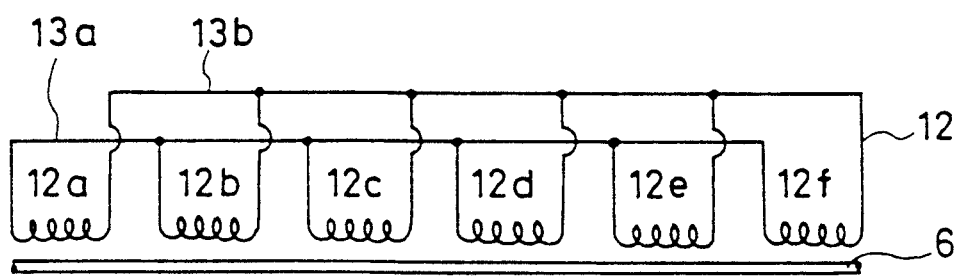
FIG. 4 is a connection diagram of another preferred embodiment of the optical current transformer in accordance with the present invention.

Another preferred embodiment of a optical current transformer in accordance with the present invention is described referring to FIG. 4 which is a connection diagram.

In FIG. 4, six windings 12a, 12b, 12c, 12d, 12e and 12f are used for removing the influence of the external magnetic flux $\phi m$. Numbers of turns and widths of respective windings 12a, 12b, 12c, 12d, 12e and 12f are equal. And overall the windings 12a, 12b, 12c, 12d, 12e and 12f are evenly wound around the whole of the core 6. Other elements for constituting the optical current transformer are the same as those of the above-mentioned embodiment shown in FIGS. 1, 2 and 3. Therefore, the other elements are omitted from the description and the illustration. The number of the windings to be provided around the core 6 is optionally selected, but is preferably in even number.

In the above-mentioned embodiments, the Faraday cell 8, which converts the intensity of the magnetic flux to the modulation of the light, is used for the current detection. Furthermore, a Hall cell, which directly converts the intensity of the magnetic flux to the potential difference, can be used.

Although the invention has been described in its preferred form with a certain degree of particularity, it is understood that the present disclosure of the preferred form has been changed in the details of construction and the combination and arrangement of parts may be resorted to without departing from the spirit and the scope of the invention as hereinafter claimed.

What is claimed is:

1. An optical current transformer comprising:
   a C-letter-shaped circular iron core which has a gap part and is provided around a bus bar in which a current to be detected flows;
   a magnetooptical cell which is provided in said gap part of said circular iron core for detecting a magnetic flux in said circular iron core for outputting a physically changed signal responding to intensity of said magnetic flux;
   means for measuring said physically changed signal; and
   at least four windings which have the same number of turns, widths of said windings being evenly provided along the whole part of said circular iron core, and terminals of respective of said windings having the same polarity being commonly connected.

2. An optical current transformer in accordance with claim 1, wherein
   said magnetooptical cell is a Faraday cell; and
   said means for detecting the intensity of said current is a photoelectric converting apparatus.

* * * * *